(12) United States Patent
Ye et al.

(10) Patent No.: US 7,075,821 B2
(45) Date of Patent: Jul. 11, 2006

(54) APPARATUS AND METHOD FOR A ONE-PHASE WRITE TO A ONE-TRANSISTOR MEMORY CELL ARRAY

(75) Inventors: Yibin Ye, Portland, OR (US); Stephen H. Tang, Pleasanton, CA (US); Ali Keshavarzi, Portland, OR (US); Dinesh Somasekhar, Portland, OR (US); Fabrice Paillet, Hillsboro, OR (US); Muhammad M. Khellah, Tigard, OR (US); Gerhard Schrom, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 10/956,407

(22) Filed: Sep. 30, 2004

(65) Prior Publication Data

US 2006/0067133 A1    Mar. 30, 2006

(51) Int. Cl.
*G11C 7/00* (2006.01)
(52) U.S. Cl. ............. 365/174; 365/189.01; 365/189.02
(58) Field of Classification Search ................ 365/174, 365/189.01, 189.02
See application file for complete search history.

(56) References Cited

U.S. PATENT DOCUMENTS 6,906,953 B1 *  6/2005  Forbes .................. 365/185.03

OTHER PUBLICATIONS

Ohsawa, Takashi et al., "Memory Design Using a One-Transistor Gain Cell on SOI", *IEEE Journal of Solid-State Circuits*, vol. 37, No. 11, Nov. 2002, pp. 1510-1522.
Yoshida, Eiji et al., "A Design of a Capacitorless IT-DRAM Cell Using Gate-induced Drain Leakage (GIDL) Current for Low-power and High-Speed Embedded Memory", 2003 IEEE, 4 pp.

* cited by examiner

*Primary Examiner*—Son T. Dinh
(74) *Attorney, Agent, or Firm*—Blakely, Sokoloff, Taylor & Zafman LLP

(57) ABSTRACT

A method and apparatus for a one-phase write to a one-transistor memory cell array. In one embodiment, the method includes a one-phase write to a selected wordline of a memory cell array. Once the wordline is selected, a logical zero value is stored within at least one memory cell of the selected wordline of the memory cell array. Simultaneously, a logical 0 value is stored within at least one memory cell of the selected wordline of the selected memory cell array. Other embodiments are described and claimed.

30 Claims, 6 Drawing Sheets

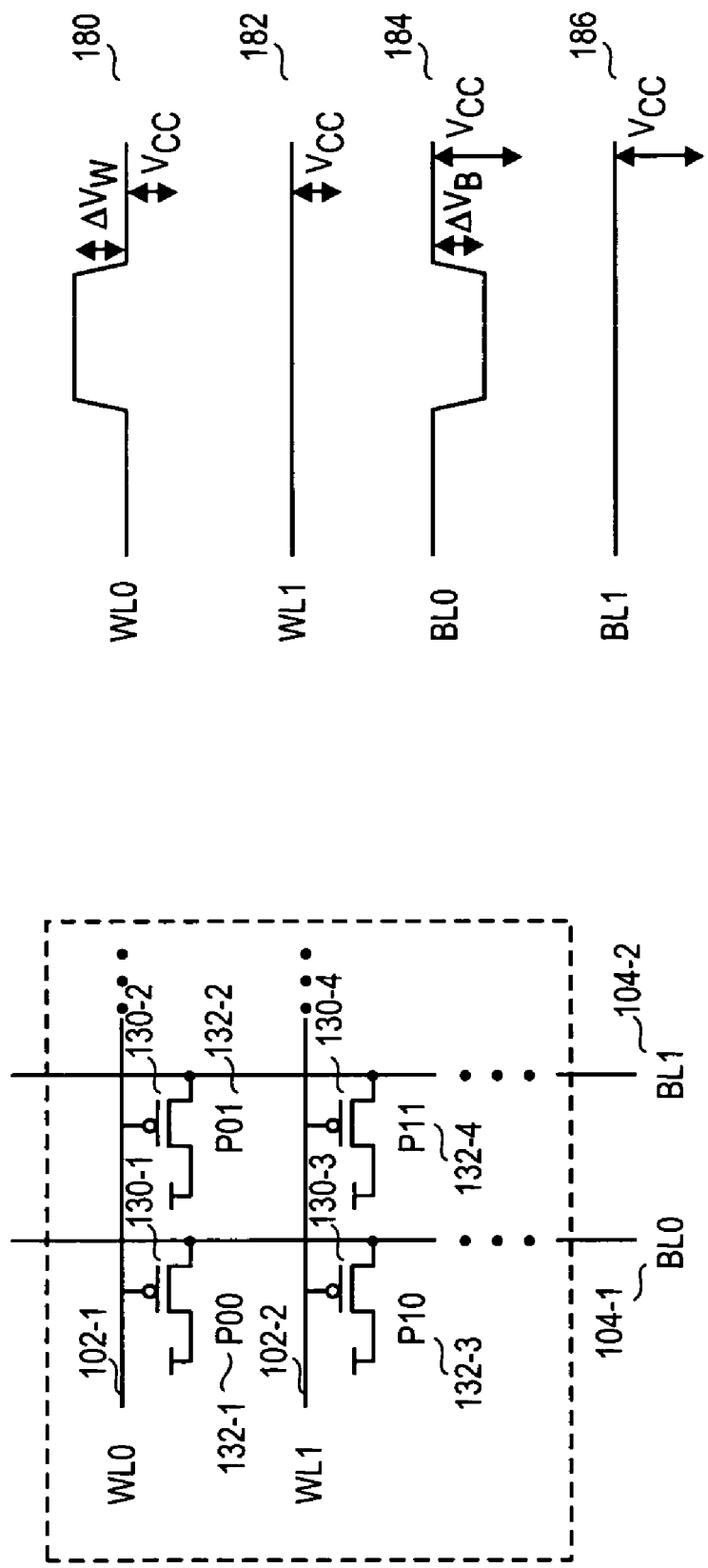

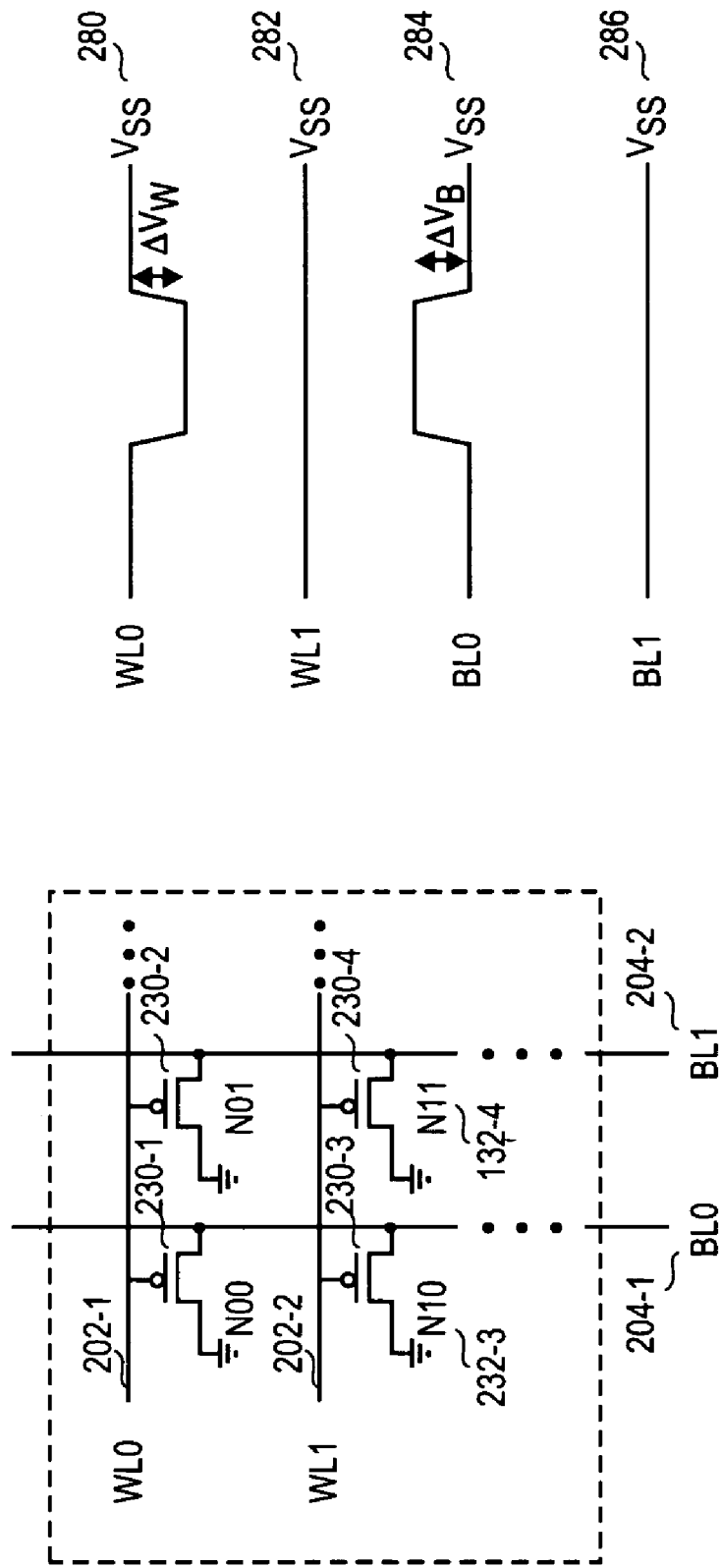

APPARATUS AND METHOD FOR A ONE-PHASE WRITE TO A ONE-TRANSISTOR MEMORY CELL ARRAY

FIELD

One or more embodiments relate generally to the field of semiconductor memories. More particularly, one or more of the embodiments relate to a method and apparatus for a one-phase write to a one-transistor memory cell array.

BACKGROUND

Embedded dense memory is desired in many applications, including microprocessors. Semiconductor memories used within microprocessors are generally comprised of a memory cell array. A memory cell array may include a plurality of memory cells arranged in rows and columns, with each memory cell coupled to a corresponding wordline and a corresponding bitline of the semiconductor memory. Multiple transistor static random access memory (SRAM) is one example of a semiconductor memory that includes a memory cell array. Unfortunately, multiple transistor SRAMs, such as a six transistor (6T) SRAM, provide insufficient density to be used within embedded dense memories.

Semiconductor memory using one transistor (1T) body storage cells as memory cells provide better density than multiple transistor SRAMs. A 1T body storage memory cell generally stores data within a transistor body. The 1T memory cell generally uses different body voltages to store logic "0" and logic "1" values. Typically, writing both a logical 0 and a logical 1 to an array of 1T memory cells is performed separately in two phases. In other words, a first phase is provided to write, for example, the logic 0 values and a second phase is provided to write logic 1 values within the 1T body storage cells of the memory cell array.

Unfortunately, accessing of the transistor body to store data can be difficult because the body of the 1T memory cells may be tied to a supply voltage (Vcc) for a p-type metal oxide semiconductor (PMOS) device or tied to ground for an n-type metal oxide semiconductor (NMOS) device. When the body is not tied to either Vcc or ground, the body may float. As a result, the two-phase write cycle for writing a logic 1 value and a logic 1 value to a body storage cell array is performed by conventional memories.

Writing a new value to an IT memory cell requires altering of the transistor body voltage. One technique for altering the body voltage is using impact ionization current in one phase and a forward biased diode in another phase to perform a write operation to the 1T body storage memory cell. The use of a forward biased diode can cause a disturbance to other unselected memory cells during a write operation.

BRIEF DESCRIPTION OF THE DRAWINGS

The various embodiments of the present invention are illustrated by way of example, and not by way of limitation, in the figures of the accompanying drawings and in which:

FIG. 2 is a block diagram further illustrating the memory cell array of FIG. 1 to illustrate a one-phase write cycle to memory cells coupled to a selected wordline, in accordance with one embodiment.

FIG. 3 is a block diagram illustrating timing diagrams for driving wordlines and bitlines in memory cell array of FIG. 2 to perform the one-phase write, in accordance with one embodiment.

FIG. 4 is a block diagram illustrating an N-type metal oxide semiconductor (NMOS) body storage memory array, which may be used as the memory cell array of memory of FIG. 1, in accordance with one embodiment.

FIG. 5 illustrates timing diagrams for driving bitlines and wordlines of the memory cells array of FIG. 4 to perform a one-phase write, in accordance with one embodiment.

DETAILED DESCRIPTION

In the following description, for the purposes of explanation, numerous specific details are set forth to provide a thorough understanding of embodiments of the present invention. It will be apparent, however, to one skilled in the art that embodiments of the present invention may be practiced without some of these specific details. In addition, the following description provides examples, and the accompanying drawings show various examples for the purposes of illustration. However, these examples should not be construed in a limiting sense as they are merely intended to provide examples of one embodiment rather than to provide an exhaustive list of all possible embodiments. In other instances, well-known structures and devices are shown in block diagram form to avoid obscuring the details of an embodiment.

Figure 1:
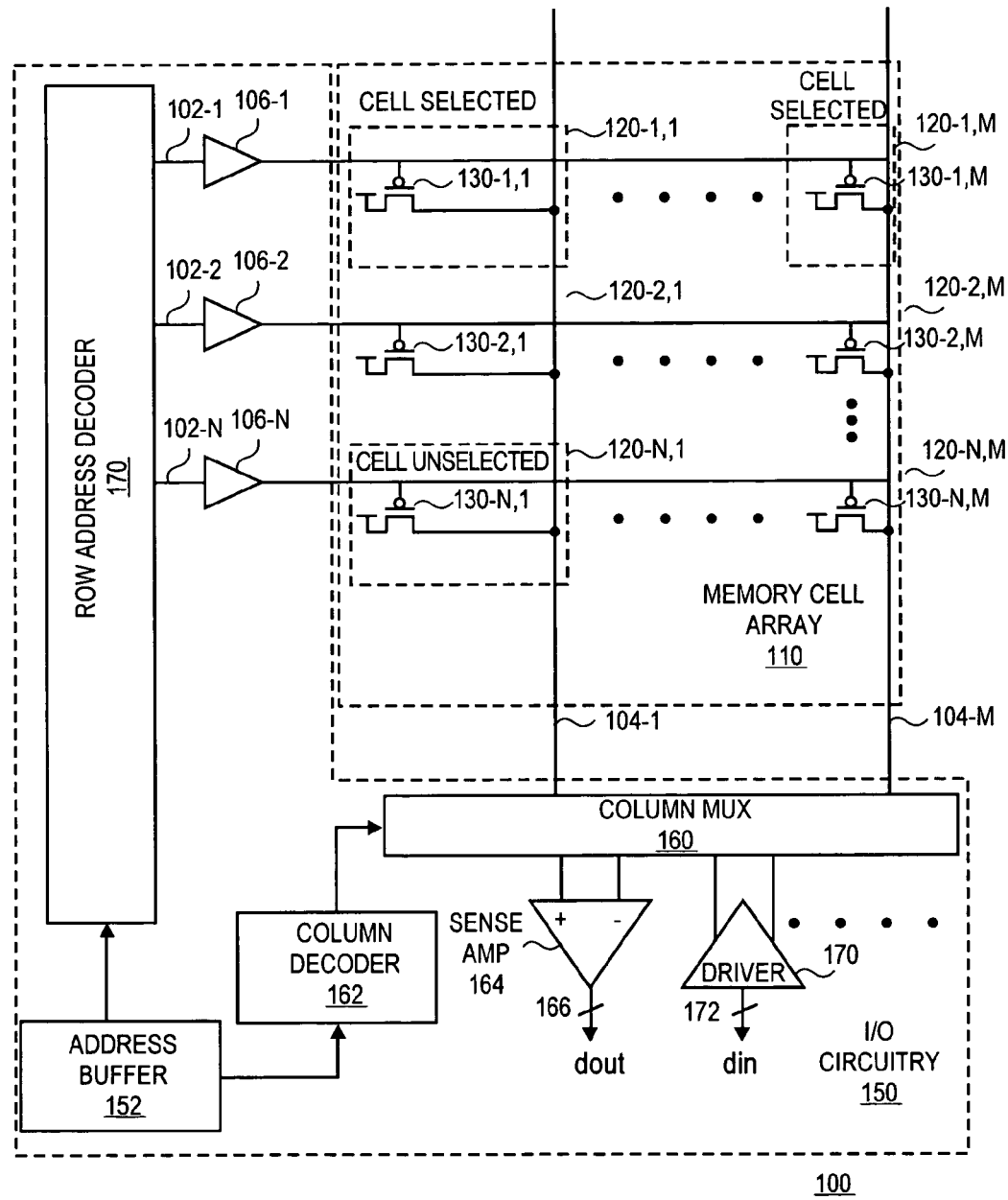
FIG. 1 is a block diagram illustrating a memory to provide a one-phase write to a one transistor memory cell array, in accordance with one embodiment.

FIG. 1 is a block diagram illustrating memory 100 including input/output (I/O) circuitry 150 to perform a one-phase write to one transistor (1T) memory cell array 110, in accordance with one embodiment. Representatively, memory cell array 110 is made up of simple cell circuits (transistors 130) arranged to share connections in horizontal rows and vertical columns. The horizontal lines, which are driven from outside the memory cell array 110, are referred to herein as "wordlines," while the vertical lines, along which data flow into and out of transistors 130 are referred to herein as "bitlines,"

In one embodiment, memory cell array 110 is comprised of a plurality of memory cells 120 (120-1, . . . , 120-N,M) referred to herein as "1T memory cells," each 1T memory cell including body storage transistor 130. Representatively, memory cell array 110 is comprised of an N×M array of transistors 130. In one embodiment, transistors 130 include P-type metal oxide semiconductor (PMOS) body storage cells. In an alternative embodiment, transistors include N-type metal oxide semiconductor (NMOS) body storage cells.

In one embodiment, 1T memory cells 120 of memory cell array 110 are electrically controlled by a plurality of wordlines 102 (102-1, . . . , 102-N) and a plurality of bitlines 104 (104-1, . . . , 104-M). Transistors 130 within 1T memory cells 120 generally store data within the transistor body. In addition, transistors 130 generally uses different body voltages to store logic "0" and logic "1" values. Typically, writing both a logic 0 value and a logic 1 value to an array of 1T memory cells is performed separately, in two phases.

According to conventional techniques for writing to a 1T memory cell array, a first phase is provided to write, for example, the logic 0 values to the 1T memory cells coupled to a selected wordline. Likewise, a second phase is provided to write logic 1 values within the 1T memory cells coupled to the selected wordline of the memory cell array. In contrast to conventional techniques, in one embodiment, I/O circuitry 150 drives a selected wordline 102 and one or more bitlines 104 to enable the storage of either logic 0 values or logic 1 values within 1T memory cells 120 during a one-phase write, for example, as illustrated with reference to FIG. 2.

In one embodiment, I/O circuitry 150 may include address buffer 152 for buffering received address information for writing/reading data to/from memory cell array 110. Representatively, row address decoder 170 receives row address information from address buffer 152. Column decoder 162 is coupled to column MUX 162 to select one or more bitlines to perform a read or write from memory cell array 110. As should be recognized, memory 100 is limited storage or retrieval of data (byte/word) at a single address during each cycle of memory operation since memory access is limited to a single wordline per cycle.

In one embodiment, row address decoder 170 is coupled to wordline drivers 106 (106-1, . . . , 106-N) for driving wordlines 102. Accordingly, using drivers 106 and MUX 160, I/O circuit electrically controls the memory cell array to perform the one-phase write described with reference to FIGS. 2 and 3 for PMOS memory cell devices and FIGS. 4 and 5 for NMOS memory cell devices. In one embodiment, sense amplifier 164 is coupled to column MUX 160 to read data output (Dout) 166 while driver 170 is coupled to column MUX 160 to write input data (Din) 172.

FIG. 2 is a block diagram further illustrating memory cell array 110 of FIG. 1. Representatively, a simplified version of memory cell array 110 is shown including wordline (WL0) 102-1 and wordline (WL1) 102-2. Likewise, bitline (BL0) 104-1 and bitline (BL1) 104-2 are shown. Operation of memory cell array 110, as shown in FIG. 2, is further described with reference to timing diagrams illustrated in FIG. 3. Memory cells 120 are accessed by selecting their row and column to read/store one of a logic 0 and a logic 1 value. In one embodiment, a one-phase write to 1T memory cells coupled to a selected wordline 102 is performed by pulling-up (pulling-down for NMOS device—See FIGS. 4 and 5) the selected wordline, pulling-down one or more bitlines 104, and maintain a voltage level of the remaining bitlines to perform the one-phase write.

In one embodiment, WL0 102-1, WL1 102-2, BL0 104-1 and BL1 104-2, are initially held at a supply voltage (Vcc) level in a hold state prior to the one-phase write. Representatively, WL0 102-1 is the selected wordline. Accordingly, WL0 is pulled-up above the Vcc voltage level (Vcc+$\Delta V_W$), as illustrated by timing diagram 180. Conversely, unselected wordline WL1 102-2 remains at Vcc voltage level, as illustrated by timing diagram 182. Once selected, wordline WL0 102-1 is driven above Vcc voltage level (Vcc+$\Delta V_W$) and BL0 104-1 is pulled down by a predetermined amount ($\Delta V_B$) to a voltage level below Vcc (Vcc−$\Delta V_B$), as illustrated by timing diagram 184. Conversely, BL1 104-2 remains at Vcc voltage level, as illustrated by timing diagram 186. Controlling of transistors 130 within 1T memory cells 120 using bitlines 104 and wordlines 102 of memory cell array 110 enables the single cycle storage of complementary logic values within 1T memory cells 130 coupled to a selected wordline. Such functionality is further described with reference to FIGS. 6 and 7.

Figure 6:
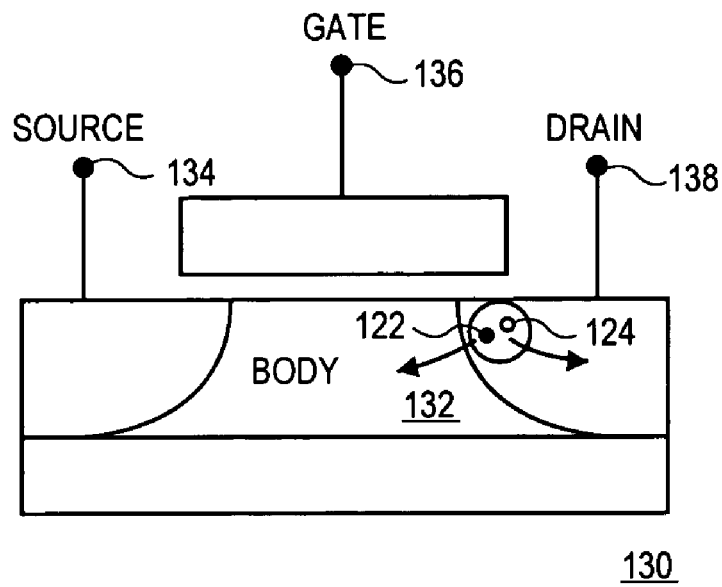
FIG. 6 is a block diagram illustrating a transistor of the memory cell array, as shown in FIGS. 1 and 2, to illustrate storage of a lower voltage in a body of the transistor, in accordance with one embodiment.

FIG. 6 is a block diagram illustrating transistor 130 of a 1T memory cell 120, as shown in FIGS. 1 and 2. Representatively, a source voltage (Vs) of source 134 is maintained at the Vcc voltage level while the voltage of the gate (Vg) is pulled-up above Vcc voltage level (Vcc+$\Delta V_W$), and a drain voltage (Vd) is pulled-down below the Vcc voltage level (VCC−$\Delta V_B$). Under such conditions, transistor 130 draws negative electrons 122 to body 132 while positive holes 124 are drawn to drain 138. As a result, a gate induced drain leakage current is caused to flow from body 132 to drain 138 of transistor 130 to achieve a lower voltage level within body 132.

Figure 7:
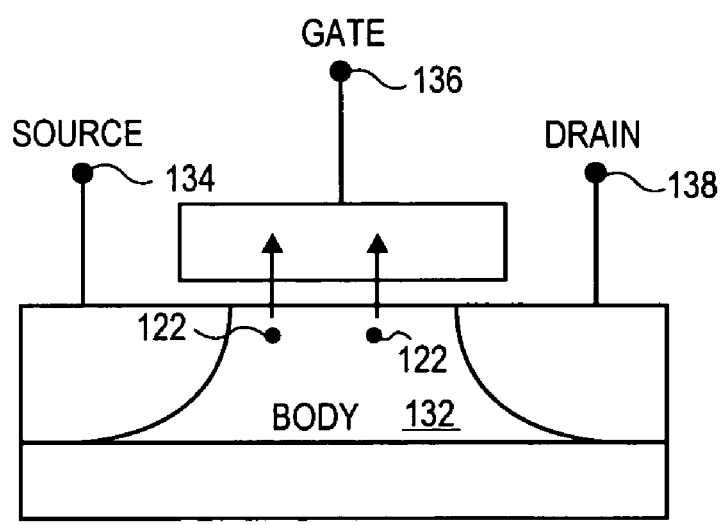
FIG. 7 is a block diagram further illustrating a transistor of memory cell array of FIG. 1 to show storage of a higher body voltage, in accordance with one embodiment.

Conversely, as illustrated in FIG. 7, source voltage Vs of transistor 130 is held at the Vcc voltage level, gate voltage Vg is pulled up above the Vcc voltage level (Vcc+$\Delta V_W$), and drain voltage Vd remains at the Vcc voltage level. Since device oxide thickness in current (and future) technology generations has been scaled to a level that generates significant oxide leakage current, in accumulation mode, as shown in FIG. 7, oxide leakage current is used to bring up the body voltage of transistor 130. As a result, an oxide leakage current is induced from gate 136 to body 132 of transistor 130 to raise the body voltage. In other words, negative electrons 122 are drawn to gate 136 causing body voltage 132 to rise.

Referring again to FIGS. 2 and 3, in a write phase, WL0 102-1 is pulled up to a voltage level above Vcc (Vcc+$\Delta V_W$) to put PMOS transistors 130-1 and 130-2 in accumulation mode while BL0 104-1 is pulled down to voltage level (Vcc−$\Delta V_B$). As described with reference to FIGS. 6 and 7, the two dominant current components at body (P00) 132-1 at body (P001) 132-2 are (1) the gate induced drain leakage (GIDL) current from body 132 to drain 138, as shown in FIG. 6, and (2) oxide leakage current from gate 138 to body 132, as shown in FIG. 7.

In one embodiment, the voltage level ($\Delta V_W$ and $\Delta V_B$) and PMOS device parameters are selected in such a way that the GIDL current is larger than the oxide leakage current when Vs=Vcc, Vg>Vcc and Vd<Vcc, as shown in FIG. 6. After a short period of time, the body voltage of P00 132-1 is pulled down to a lower voltage level by the larger GIDL current. Conversely, when Vs=Vcc, Vg>Vcc and Vd=Vcc, the oxide leakage current is the dominant current as shown in FIG. 7. There is very little GIDL current in this condition. Hence, after a short period of time, the body voltage of P01 132-2 is pulled-up to a larger voltage level by the oxide leakage current.

Accordingly, as shown in FIG. 2, BL1 104-2 remains high at the Vcc voltage level (Vd=Vcc) to cause an oxide leakage current from gate 138 to body 132, as shown in FIG. 7. Accordingly, the oxide leakage current is the dominant component so that a voltage of body 132 is brought to a higher level. As the 1T memory cells 120 of memory cell array 110 are PMOS devices, conventionally, higher body voltages represent a logic 0 value and lower voltages represent a logic 1 value in a PMOS 1T memory cell. Accordingly, a logic 0 value is written into body P01 132-2 and a logic 1 value is written into body P00 132-1 in the same phase, as shown in FIG. 2.

FIG. 4 is a block diagram illustrating memory cell array 210 including memory cells 230-1, 230-2, 230-3 and 230-4. In the embodiment illustrated, memory cells 130 are NMOS devices. Accordingly, as illustrated in FIG. 5, during a write cycle, selected wordline WL0 202-1 is pulled down as illustrated by timing diagram 280 while unselected wordline WL1 102-2 remains at a source voltage level (Vss). To perform the one-phase write cycle, BL0 204-1 is pulled up above Vss voltage level, as illustrated by timing diagram 284 while BL1 204-2 remains at the Vss voltage level (Vss+$\Delta V_B$), as illustrated by timing diagram 286. Accordingly, by driving wordlines 102 and bitlines 104, as illustrated by the timing diagrams of FIG. 5, a body voltage of body (N001) 232-1 will store a logic 1 value while a logic 0 value is stored within a body (N00) 232-2 of memory cell 130-2.

Figure 8:
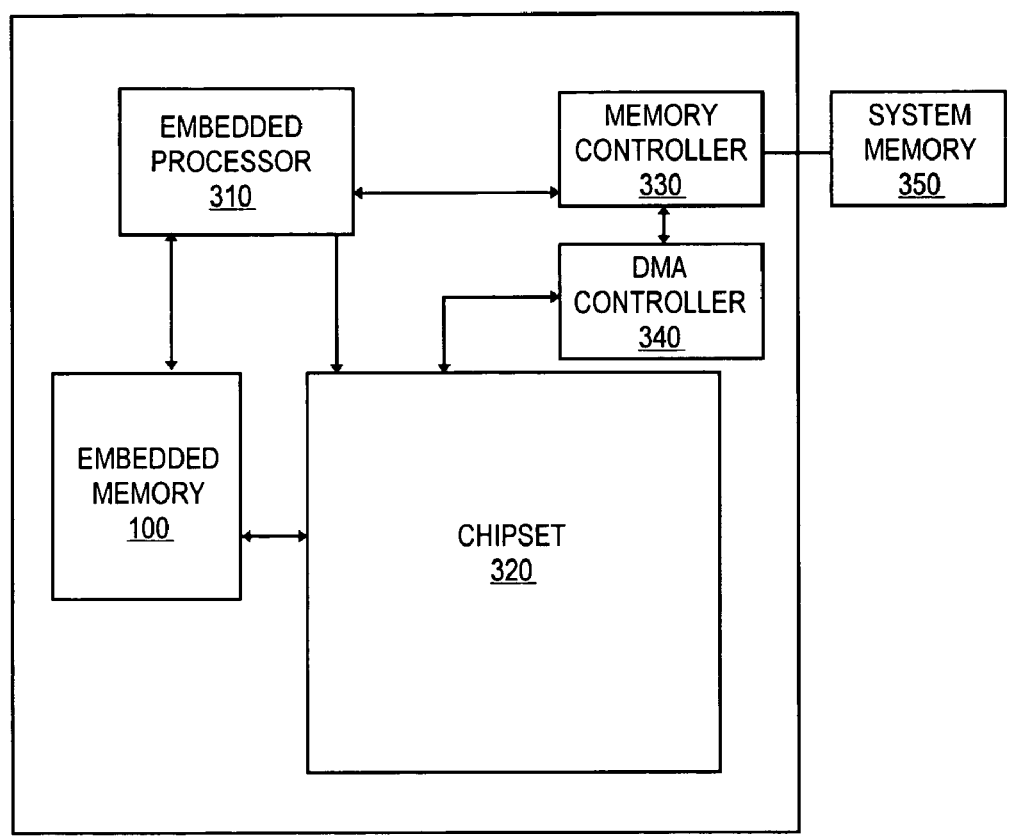
FIG. 8 is a block diagram illustrating a system on-chip, including an embedded memory as shown in FIG. 1, in accordance with one embodiment.

FIG. 8 is a block diagram illustrating system on-chip (SOC) 300 including embedded memory 100, as shown in FIG. 1. Representatively, SOC 300 includes embedded processor 310 coupled to embedded memory 100. Likewise, SOC 300 may include chipset 320. As described herein, the term "chipset" is used in a manner to collectively describe the various devices coupled to embedded processor 310 to perform desired system functionality, as required by SOC 300.

As further illustrated, SOC 300 may include direct memory access (DMA) controller 340 to receive DMA requests from chipset 320. In response to such requests, DMA controller 340 may request memory controller 330 to perform DMA access from off-chip system memory 350. In one embodiment, memory controller 330 and DMA controller 340 are integrated within chipset 310. In one embodiment, embedded memory 110 is dense memory that may be used to perform SOC functionality as desired by embedded processor 310. However, additional memory access may be required to off-chip system memory 350 to provide further SOC 300 functionality.

Figure 9:
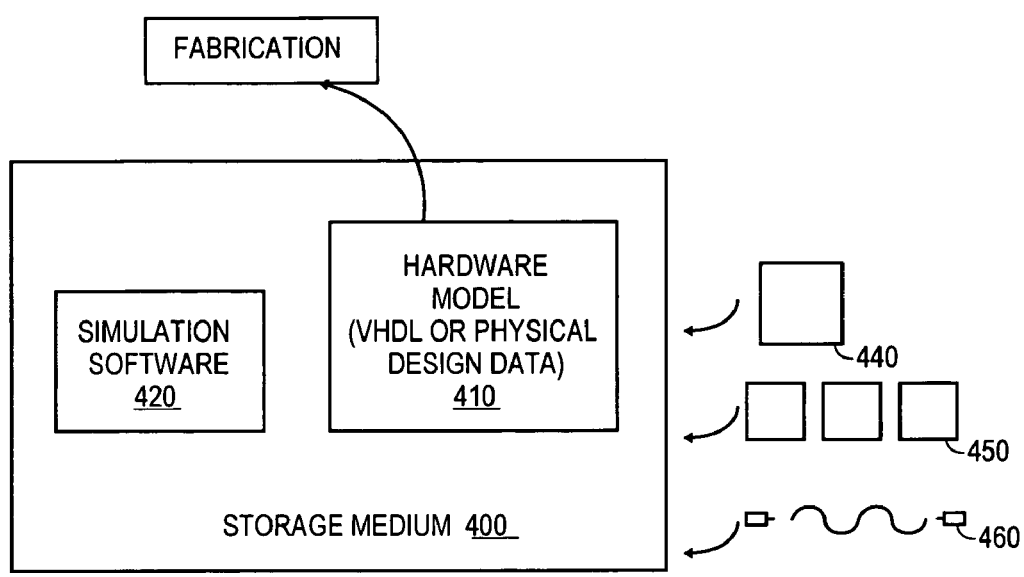
FIG. 9 is a block diagram illustrating various design representations or formats for emulation, simulation and fabrication of a design using the disclosed techniques.

FIG. 9 is a block diagram illustrating various representations or formats for simulation, emulation and fabrication of a design using the disclosed techniques. Data representing a design may represent the design in a number of manners. First, as is useful in simulations, the hardware may be represented using a hardware description language, or another functional description language, which essentially provides a computerized model of how the designed hardware is expected to perform. The hardware model 410 may be stored in a storage medium 400, such as a computer memory, so that the model may be simulated using simulation software 420 that applies a particular test suite 430 to the hardware model to determine if it indeed functions as intended. In some embodiments, the simulation software is not recorded, captured or contained in the medium.

In any representation of the design, the data may be stored in any form of a machine readable medium. An optical or electrical wave 460 modulated or otherwise generated to transport such information, a memory 450 or a magnetic or optical storage 440, such as a disk, may be the machine readable medium. Any of these mediums may carry the design information. The term "carry" (e.g., a machine readable medium carrying information) thus covers information stored on a storage device or information encoded or modulated into or onto a carrier wave. The set of bits describing the design or a particular of the design are (when embodied in a machine readable medium, such as a carrier or storage medium) an article that may be sealed in and out of itself, or used by others for further design or fabrication.

ALTERNATIVE EMBODIMENTS

It will be appreciated that, for other embodiments, a different system configuration may be used. For example, while the SOC 300 includes a single processor 310, for other embodiments, a multiprocessor system (where one or more processors may be similar in configuration and operation to the processor 110 described above) may benefit from the one-phase write to the 1T memory cell array of various embodiments. Further different type of system or different type of computer system such as, for example, a server, a workstation, a desktop computer system, a gaming system, an embedded computer system, a blade server, etc., may be used for other embodiments.

Having disclosed embodiments and the best mode, modifications and variations may be made to the disclosed embodiments while remaining within the scope of the embodiments of the invention as defined by the following claims.

What is claimed is:

1. A method comprising:
   storing a logic 0 value within at least one memory cell of a selected wordline of a memory cell array; and
   storing a logic 1 value within at least one memory cell of the selected wordline of the memory cell array, wherein the logic 0 and the logic 1 values are stored during a one-phase write cycle to the selected wordline of the memory cell array.

2. The method of claim 1, wherein storing the logic 1 value within the memory cell array comprises:
   inducing a drain leakage current from a body to a drain of the at least one memory cell to store the logic 1 value.

3. The method of claim 1, wherein storing the logical 0 value comprises:
   inducing an oxide leakage current from a gate to a body of the at least one memory cell to store the logic 0 value.

4. The method of claim 1, wherein prior to storing the logical 0 value, the method further comprises:
   holding a voltage level of each wordline of the memory cell array at a supply voltage (Vcc) level; and
   holding a voltage of each bitline of the memory cell array at the Vcc voltage level.

5. The method of claim 1, wherein storing the logic 1 value comprises:
   altering a voltage level of the selected wordline from a first voltage level to a second voltage level; and
   altering a voltage level of a bitline coupled to the at least one memory cell from the first voltage level to a third voltage level to store the logic 1 value in a body of the at least one memory cell.

6. The method of claim 5, wherein the first voltage level is a supply voltage (Vcc) level, the second voltage level is greater than the Vcc voltage level by a first predetermined amount and the third voltage level is less than the Vcc voltage level by a second predetermined amount.

7. The method of claim 5, wherein the first voltage level is a source voltage (Vss) level, the second voltage level is less than the Vcc voltage level by a first predetermined amount and the third voltage level is greater than the Vss voltage level by a second predetermined amount.

8. The method of claim 1, wherein storing the logical 0 value comprises:
   altering a voltage level of the selected wordline from a first voltage level to a second voltage level; and maintaining a voltage level of a bitline coupled to the at least one memory cell at the first voltage level to store the logic 0 value in a body of the at least one memory cell.

9. The method of claim 7, wherein the first voltage level is a supply voltage (Vcc) level and the second voltage level is greater than the Vcc voltage level by a predetermined amount.

10. The method of claim 8, wherein the first voltage level is a source voltage (Vss) level and the second voltage level is less than the Vss voltage level by a first predetermined amount.

11. A machine readable medium having embodied thereon a circuit design for fabrication into a circuit which, when fabricated, comprises:
   a memory cell array including a plurality of memory cells arranged in rows and columns; and
   an input/output (I/O) circuit to store a logic 0 value within at least one memory cell of a selected wordline and to store a logic 1 value within at least one memory cell of the selected wordline during a one-phase write cycle to the selected wordline of the memory cell array.

12. The machine readable medium of claim 11, wherein he circuit further comprises:
   a plurality of wordlines, each connected to a corresponding one of the rows of the memory cell arrays; and
   a plurality of bitlines, each bitline connected to a corresponding one of the columns of the memory cells.

13. The machine readable medium of claim 11, wherein the I/O circuit is further to alter a voltage level of the selected wordline from a first voltage level to a second voltage level and to maintain a voltage level of a bitline coupled to the at least one memory cell at the first voltage level to store the logic 0 value in a body of the at least one memory cell.

14. The machine readable medium of claim 13, wherein the first voltage level is a supply voltage (Vcc) level and the second voltage level is greater than the Vcc voltage level by a predetermined amount.

15. The machine readable medium of claim 11, wherein the I/O circuit is further to alter a voltage level of the selected wordline from a first voltage level to a second voltage level, and to alter a voltage level of a bitline coupled to the at least one memory cell from the first voltage level to a third voltage level to store the logic 1 value in a body of the at least one memory cell.

16. The machine readable medium of claim 15, wherein the first voltage level is a supply voltage (Vcc) level, the second voltage level is greater than the Vcc voltage level by a first predetermined amount and the third voltage level is less than the Vcc voltage level by a second predetermined amount.

17. A memory, comprising:
   a memory cell array including a plurality of memory cells arranged in rows and columns;
   a plurality of wordlines, each connected to a corresponding one of the rows of the memory cell arrays;
   a plurality of bitlines, each bitline connected to a corresponding one of the columns of the memory cells; and
   an input/output (I/O) circuit to store a logic 0 value within at least one memory cell of a selected wordline and to store a logic 1 value within at least one memory cell of the selected wordline during a one-phase write cycle to the selected wordline of the memory cell array.

18. The memory of claim 17, wherein the memory cells comprise one transistor body storage cells.

19. The memory of claim 17, wherein the one transistor body storage cells comprise p-type metal oxide semiconductor devices.

20. The memory of claim 17, wherein the one transistor body storage cells comprise n-type metal oxide semiconductor devices.

21. The memory of claim 17, wherein the I/O circuit further comprises:
   a row address decoder coupled to each of the plurality of wordlines via a plurality of wordline drivers, the wordline drivers to hold each wordline of the memory at a supply voltage level in a hold state prior to a write operation.

22. The memory of claim 17, wherein the I/O circuit further comprises a column multiplexer coupled to each of the plurality of bitlines of the memory, the column multiplexer to select one or more bitlines according to a column decoder coupled to column multiplexer.

23. The memory of claim 17, wherein the I/O circuit is to induce a drain leakage current from a body to a drain of the memory cell to store the logic 0 value and to induce a drain leakage current from a body to a drain of the memory cell to store the logic 1 value.

24. The memory of claim 17, wherein the I/O circuit is to alter a voltage level of the selected wordline from a first voltage level to a second voltage level, to maintain a voltage level of a bitline coupled to the at least one memory cell at the first voltage level to store the logic 0 value in a body of the at least one memory cell, and to alter a voltage level of a bitline coupled to the at least one memory cell from the first voltage level to a third voltage level to store the logic 1 value in a body of the at least one memory cell.

25. The memory of claim 24, wherein the first voltage level is a supply voltage (Vcc) level and the second voltage level is greater than the Vcc voltage level by a predetermined amount.

26. The memory of claim 24, wherein the first voltage level is a supply voltage (Vcc) level, the second voltage level is greater than the Vcc voltage level by a first predetermined amount and the third voltage level is less than the Vcc voltage level by a second predetermined amount.

27. A system comprising:
   an embedded processor; and
   an embedded memory coupled to the embedded processor, the embedded memory comprising:
      a memory cell array including a plurality of memory cells arranged in rows and columns,
      a plurality of wordlines, each connected to a corresponding one of the rows of the memory cell arrays,
      a plurality of bitlines, each bitline connected to a corresponding one of the columns of the memory cells, and
      an input/output (I/O) circuit to store a logic 0 value within at least one memory cell of a selected wordline and to store a logic 1 value within at least one memory cell of the selected wordline during a one-phase write cycle to the selected wordline of the memory cell array.

28. The system of claim 27, wherein the I/O further comprises:
   a row address decoder coupled to each of the plurality of wordlines via a plurality of wordline drivers, the wordline drivers to hold each wordline of the memory at a supply voltage level in a hold state prior to a write operation; and a column multiplexer coupled to each of the plurality of bitlines of the memory, the column multiplexer to select one or more bitlines according to a column decoder coupled to column multiplexer.

29. The system of claim 27, further comprising:
a memory controller coupled to the processor; and
a system memory coupled to the memory controller.

30. The system of claim 27, wherein the memory cells comprise on transistor body storage cells; and
wherein the one transistor body storage cells comprise p-type metal oxide semiconductor devices and n-type metal oxide semiconductor devices.

* * * * *